United States Patent
Hellings et al.

(10) Patent No.: US 8,698,129 B2
(45) Date of Patent: Apr. 15, 2014

(54) IMPLANT FREE QUANTUM WELL TRANSISTOR, METHOD FOR MAKING SUCH AN IMPLANT FREE QUANTUM WELL TRANSISTOR AND USE OF SUCH AN IMPLANT FREE QUANTUM WELL TRANSISTOR

(71) Applicants: IMEC, Leuven (BE); Katholieke Universiteit Leuven, K.U. Leuven R&D, Leuven (BE)

(72) Inventors: Geert Hellings, Heverlee (BE); Geert Eneman, Balen (BE)

(73) Assignees: IMEC, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 13/723,149

(22) Filed: Dec. 20, 2012

(65) Prior Publication Data

US 2013/0161588 A1    Jun. 27, 2013

(30) Foreign Application Priority Data

Dec. 23, 2011    (EP) .................................... 11195619

(51) Int. Cl.
*H01L 29/06*    (2006.01)

(52) U.S. Cl.
USPC ...... 257/29; 257/192; 257/256; 257/E29.168; 257/E29.245

(58) Field of Classification Search
USPC ............. 257/29, 192, 256, E29.168, E29.245
See application file for complete search history.

(56) References Cited

U.S. PATENT DOCUMENTS 6,063,677 A    5/2000  Rodder et al.
8,183,556 B2 *    5/2012  Dattà et al. .................... 257/192

FOREIGN PATENT DOCUMENTS

EP             2120266 A1    11/2009
WO    WO2010/081530 A1    7/2010

OTHER PUBLICATIONS

Rubin, Leonard et al., "Process Control Issues for Retrograde Well Implants for Narrow n+/p+ Isolation in CMOS", ION Implantation Technology, Proceedings of the 14th International Conference, Sep. 2002, pp. 17-20.
Hellings, Geert et al., "Implant-Free SiGe Quantum Well pFET: A Novel, Highly Scalable and Low Thermal Budget Device, Featuring Raised Source/Drain and High-Mobility Channel", IEEE International Electron Devices Meeting—IEDM, Dec. 2010, pp. 241-244.
Hellings, Geert et al., "The Implant-Free Quantum Well FET: Harnessing the Power of Heterostructures", Proceedings of ICSI 2011 Conference, Oct. 2011, 2 pages.
Mitard, J. et al., "1mA/um-Ion Strained SiGe 45%-IFQW pFETs With Raised and Embedded S/D", Symposium on VLSI Technology Digest of Technical Papers, Jun. 2011, pp. 134-135.
European Search Report, European Patent Application 11195619.9 dated Mar. 16, 2012.
Benbakhti, B. et al., "Monte Carlo Analysis of In0.53Ga0.47 As Implant-Free Quantum-Well Device Performance", Silicon Nanoelectronics Workshop, Jun. 2010, pp. 1-2.

* cited by examiner

*Primary Examiner* — Tu-Tu Ho
(74) *Attorney, Agent, or Firm* — McDonnell Boehnen Hulbert & Berghoff LLP

(57) ABSTRACT

An implant free quantum well transistor wherein the doped region comprises an implant region having an increased concentration of dopants with respect to the concentration of dopants of adjacent regions of the substrate, the implant region being substantially positioned at a side of the quantum well region opposing the gate region.

9 Claims, 2 Drawing Sheets

IMPLANT FREE QUANTUM WELL TRANSISTOR, METHOD FOR MAKING SUCH AN IMPLANT FREE QUANTUM WELL TRANSISTOR AND USE OF SUCH AN IMPLANT FREE QUANTUM WELL TRANSISTOR

CROSS-REFERENCE TO RELATED APPLICATION

This application claims priority to European Patent Application No. 11195619.9 filed on Dec. 23, 2011, the contents of which are hereby incorporated by reference.

FIELD

The current disclosure relates to an implant free quantum well transistor. The present disclosure also relates to a method for making such an implant free quantum well transistor and the use of such an implant free quantum well transistor.

BACKGROUND

Implant free quantum well transistors are already known to the person skilled in the art. Geert Hellings et al. in "Implant-Free SiGe Quantum Well pFET: A novel, highly scalable and low thermal budget device, featuring raised source/drain and high-mobility channel," IEEE International Electron Devices Meeting—IEDM, pp. 241-244, 2010, European patent application EP 2 120 266 A1 and Geert Hellings et al, in "The implant-free quantum well field-effect transistor: Harnessing the power of heterostructures" in the proceedings of ICSI 2011 conference for example describe such an implant free quantum well (IFQW) transistor.

The transistor comprises a substrate. A multi-layer quantum well region forming the quantum well of the transistor overlies the substrate. Further a gate region forming the transistor gate, shortly the gate, overlies a first portion of the quantum well region while a source region forming the transistor source, shortly the source, overlies a second portion different from and adjacent to the first portion of the quantum well region and a drain region forming the transistor drain, shortly the drain, overlies a third portion different from and adjacent to the first portion of the quantum well region. The source region and the drain region are positioned on opposite sides of the gate region. The substrate comprises a doped region for controlling the mobile charge carrier concentration for establishing an electrical connection between the source and the drain depending on the gate voltage applied to the gate. The doped region extends over the entire substrate at a side of the quantum well region opposing the source region, the drain region and the gate region.

According to a first configuration of such IFQW transistor the doped region, i.e. the substrate, has a low uniformly distributed doping, i.e. a uniform doping having a concentration of $1\times10^{17}$ particles per $cm^3$. Although such transistors have been found to show a low source/drain capacitance, such transistors have the disadvantage that they have a limited short channel control, a small body factor, and that the $V_T$ may be off-target.

According to a second configuration of such an IFQW transistor, the doped region, i.e. the substrate, has a high uniformly distributed doping, i.e. a uniform doping having a concentration of $1\times10^{18}$ particles per $cm^3$. Although such transistors have been found to show a high source/drain capacitance they show an improved short channel control, a higher body factor and a shifted $V_T$. Related information can be found in Mitard et al in, "1 mA/um-ION strained SiGe45%-IFQW pFETs with raised and embedded S/D" p 134-135 Digest of Technicap papers, Symposium on VLSI circuits (VLSIC) Kyoto 2011.

SUMMARY

Therefore, it is an aim of the current disclosure to provide an IFQW transistor showing a low source/drain capacitance in combination with an improved short channel control, a higher body factor and a shifted $V_T$.

This is achieved according to an IFQW transistor. Thereto, the doped region comprises an implant region having an increased, preferably local, concentration of dopants with respect to the concentration of dopants of adjacent regions of the substrate, the implant region being substantially positioned at a side of the quantum well region opposing the gate region.

It has been found that such an implant region both offers the advantage of having a relatively low source drain capacitance, as the increased concentration of dopants is substantially limited to below the gate region, and does not substantially extend, or preferably does not extend at all, below the source or drain. Moreover, the benefits of a high uniformly distributed substrate doping are surprisingly nevertheless provided by the implant region. The IFQW transistor according to the disclosure, therefore, shows the combined benefits of both embodiments according to the prior art whereas avoiding their relating drawbacks.

Moreover, it has been found that with a relatively low concentration of dopants, a concentration which is lower than the known concentrations of high uniform doped substrates, a properly functioning transistor gate can be obtained between the source and the drain. Concentrations of dopants of the implant region are for example between $1\times10^{16}$ particles per $cm^3$ and $5\times10^{18}$ particles per $cm^3$, preferably between $5\times10^{16}$ particles per $cm^3$ and $5\times10^{18}$ particles per $cm^3$, more preferably between $5\times10^{16}$ particles per $cm^3$ and $3\times10^{18}$ particles per $cm^3$ and more preferably between $1\times10^{17}$ particles per $cm^3$ and $3\times10^{18}$ particles per $cm^3$ and most preferably between $2\times10^{17}$ particles per $cm^3$ and $2\times10^{18}$ particles per $cm^3$.

According to preferred embodiments of the current disclosure, the implant region is enclosed by adjacent regions of the substrate. In such configurations, at least part of the substrate that is not part of the implant region is located between the implant region and the quantum well region such that the risk that charge carriers, during electrical connection between the source and the drain and when travelling between the source and the drain, collide with the dopants implanted in the implant region, reducing the mobility of the charge carriers and, therefore, the conductance of the connection between the source and the drain.

According to preferred embodiments of the current disclosure, the doped region extends at a side of the quantum well region opposing the source region, the drain region, and the gate region. In such an embodiment, large parts are doped or even substantially the whole substrate is doped.

According to preferred embodiments of the current disclosure, the doped region, excluding the implant region, has a concentration of dopants of between $1\times10^{16}$ particles per $cm^3$ and $5\times10^{18}$ particles per $cm^3$, preferably between $5\times10^{16}$ particles per $cm^3$ and $5\times10^{18}$ particles per $cm^3$, more preferably between $5\times10^{16}$ particles per $cm^3$ and $3\times10^{18}$ particles per $cm^3$ and most preferably between $1\times10^{17}$ particles per $cm^3$ and $3\times10^{18}$ particles per $cm^3$. The concentration of dopants of the doped region, excluding the implant region, and the concentration of dopants of the implant region are in any case chosen such that the implant region has an increased, preferably local, concentration of dopants with respect to the concentration of dopants of adjacent regions of the substrate.

According to preferred embodiments of the current disclosure, the concentration of dopants of the implant region, is for example substantially between two and five times, preferably between two and three times, most preferably substantially two times, the concentration of dopants of the doped region, excluding the implant region, if the doped region, excluding the implant region has been doped.

According to preferred embodiments of the current disclosure, the transistor comprises spacers in between the gate region and the source and the drain region for substantially electrically insulating the gate from the source and the drain as such spacers reduce the risk that one of the source, the drain or the gate become electrically interconnected which is not desired.

According to preferred embodiments of the current disclosure, the material of the substrate and/or the quantum well is a semiconductor and more preferably one or more of the following: silicon; germanium; more specifically silicon-germanium, possibly with additional elements such as carbon added in relatively low concentrations; III-V compound semiconductors; and antimonides.

According to preferred embodiments of the current disclosure, the quantum well region is layered.

According to preferred embodiments of the current disclosure, when the material of the substrate and/or the quantum well is silicon and/or germanium, more specifically silicon-germanium, the dopants are one or more of the following: boron, gallium, indium, phosphorus, antimonide, and/or arsenic.

The disclosure also relates to a method for making an implant free quantum well transistor according to the disclosure.

According to preferred embodiments of the method according to the disclosure, in a first step a dummy gate IFQW transistor is provided. The dummy gate IFQW transistor comprises a substrate, a quantum well region forming the quantum well of the transistor and overlying the substrate, a dummy gate region overlying a first portion of the quantum well region, a source region forming the transistor source and overlying a second portion different from and adjacent to the first portion of the quantum well region and a drain region forming the transistor drain and overlying a third portion different from and adjacent to the first portion of the quantum well region. The source region and the drain region are positioned on opposing sides of the dummy gate region. Subsequently, the dummy gate region is at least partly removed such as to expose the quantum well region, the substrate is doped by applying implants to an implant region of the substrate substantially below the first portion of the quantum well region such that an increased concentration of dopants with respect to adjacent regions of the substrate is obtained and a replacement gate region is applied replacing at least partly the removed part of the dummy gate region. The replacement gate forms the transistor gate of the obtained IFQW transistor. The gate region is substantially positioned at a side of the quantum well region opposing the implant region. The implant region of the substrate controls the charge carriers for establishing an electrical connection between the transistor source and the transistor drain depending on the gate voltage applied to the transistor gate.

It has surprisingly been found that application of implants in the substrate below the quantum well channel region is possible, without seriously affecting the structure and composition of the quantum well. Especially, when the concentration of the dopants in the implant region is lower than $5 \times 10^{18}$ particles per $cm^3$ it has been found that sufficient charge carriers can be made available for electrical conduction between source and drain whereas the risk for damaging the quantum well channel region is reduced with respect to implant regions where the concentration of dopants corresponds to the concentration of dopants in the known substrates having a high uniformly distributed doping.

According to preferred embodiments of the method according to the disclosure, prior to removing the dummy gate, an oxide fill is provided at the upper surface of the dummy gate IFQW covering the source region, the drain region and the dummy gate region.

According to preferred embodiments of the method according to the disclosure, after providing the oxide fill, the dummy gate region is exposed prior to removing the dummy gate.

According to preferred embodiments of the method according to the disclosure, exposing the dummy gate is done by chemical-mechanical polishing.

According to preferred embodiments of the method according to the disclosure, the dummy gate is removed by etching.

The disclosure also relates to the use of the IFQW transistor according to the disclosure, for example the use of the IFQW transistor according to the disclosure in an electronic circuit, for example a chip.

The disclosure will be further elucidated by means of the following description and the appended figures.

DETAILED DESCRIPTION

Figure 1:
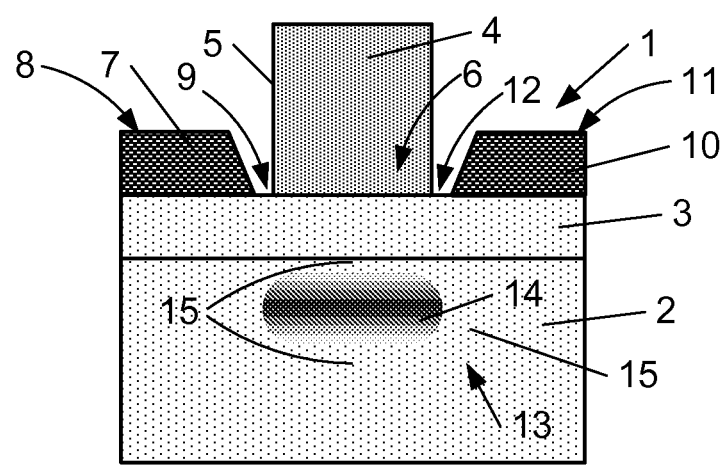
FIG. 1 shows a schematic cross-section of an embodiment of the implant free quantum well (IFQW) transistor according to the disclosure.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

In the present disclosure, the term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present disclosure include, but are not limited to alloys of InAlGaAs, AlAs, InN, MN, GaN, InAlGaN GaAs, InP, InSb, InGaAs, AlGaAs, InAIAs, InAlAsSb, InAlAsP and InGaAsP.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

1. IFQW transistor
2. Substrate
3. Quantum well region
4. Gate region
5. Transistor gate
6. First portion
7. Source region
8. Transistor source
9. Second portion
10. Drain region
11. Transistor drain
12. Third portion
13. Doped region
14. Implant region
15. Adjacent regions
16. Dummy gate region
17. Oxide fill
18. Upper surface of the dummy gate
19. Spacers
20. Dummy gate IFQW transistor FIG. 1 shows a preferred embodiment of an implant free quantum well (IFQW) transistor 1 according to the disclosure.

The IFQW transistor 1 comprises:
a substrate 2,
a quantum well region 3 forming the quantum well of the IFQW transistor 1 and overlying the substrate 2,
a gate region 4 forming the transistor gate 5 and overlying a first portion 6 of the quantum well region 3,
a source region 7 forming a transistor source 8 and overlying a second portion 9 different from and adjacent to the first portion 6 of the quantum well region 3, and
a drain region 10 forming a transistor drain 11 and overlying a third portion 12 different from and adjacent to the first portion 6 of the quantum well region 3.

The source region 7 and the drain region 10 are positioned on opposite sides of the gate region 4, and the substrate 2 comprises a doped region 13 for controlling the mobile charge carrier concentration for establishing an electrical connection between the transistor source 8 and the transistor drain 11 depending on a gate voltage applied to the transistor gate 5.

The doped region 13 comprises an implant region 14 having an increased concentration of dopants with respect to the concentration of dopants of adjacent regions 15 of the substrate 2, wherein the implant region 14 is substantially positioned at a side of the quantum well region 3 opposing the gate region 4.

As can be seen in FIG. 1, the implant region 14 preferably is enclosed, preferably fully enclosed, by adjacent regions 15 of the substrate 2. This is, however, not critical for the disclosure, and the implant region 14 can also be only partially enclosed by the adjacent regions 15 of the substrate 2.

Although the implant region 14 shown in FIG. 1 has an oval cross section, the exact shape of the implant region 14 is not critical for the disclosure and any other cross section deemed appropriate by the person skilled in the art can be used depending on, for example, the nature of the transistor source 8, transistor drain 11 and transistor gate 5 of the desired transistor 1.

Preferably, as shown in FIG. 1, the implant region 14 is positioned substantially below, preferably directly below, the transistor gate 5 and preferably does not extend to regions of the substrate 2 facing the source 7 or drain region 10 as such an implant region 14 again increases the risk for the undesired effects of a uniform high substrate doping as discussed above.

Although a single implant region 14 is depicted in FIG. 1, multiple implant regions 14 are also possible. However, preferably, all implant regions 14 are positioned substantially below the gate 5 such as to avoid the risk for the undesired effects of a uniform high substrate doping as discussed above.

Next to the position of the implant region 14 with respect to the source region 7, drain region 10, and gate region 4 in a plane substantially parallel to the plane of the quantum well 3, the depth of the implant region 14 in the substrate 2 with respect to the quantum well 3 can be determined by the person skilled in the art depending on, for example, the nature of the transistor source 8, transistor drain 11 and transistor gate 5 of the desired IFQW transistor 1.

FIG. 1 shows that the doped region 13 equals the implant region 14 and the part of the substrate 2 excluding the implant region 14 is not doped. This is, however, not critical for the disclosure, and although not shown in FIG. 1, the doped region 13 can extend from the implant region 14 at a side of the quantum well region 3 opposing the source region 7, the drain region 10, and even the gate region 4. For example, the part of the substrate 2 excluding the implant region 14 could also be doped, a portion of the part of the substrate 2 excluding the implant region 14 could be doped, etc. The doping of the doped region 13, when extending beyond the implant region 14, can be determined by the person skilled in the art, depending on, for example, the desired properties of the IFQW transistor 1, etc.

Although not shown in FIG. 1, the IFQW transistor 1 preferably comprises spacers in between the gate region 4 and the source region 7 and the drain region 10 for substantially electrically insulating the transistor gate 5 from the transistor source 8 and the transistor drain 11. See FIGS. 2a-2f for an example that shows such spacers 19.

Although any type of dopant can be used by the person skilled in the art for the doping region 13 and/or more specifically the implant region 14, when the material of the substrate 2 is silicon and/or germanium, more specifically silicon-germanium, the dopants preferably are one or more of the following: boron, gallium, indium, phosphorus, antimonide, and/or arsenic. When the material of the substrate 2 is for example one or more of III/V compound semiconductors, the dopants preferably are one or more of the following: silicon, carbon, and/or zinc.

Any type of quantum well deemed appropriate can be used by the person skilled in the art, for example a layered quantum well as described in for example EP 2 1202 66A1 and/or the quantum wells described in for example Geert Hellingset al., "Implant-Free SiGe Quantum Well pFET: A novel, highly scalable and low thermal budget device, featuring raised source/drain and high-mobility channel," IEEE International Electron Devices Meeting—IEDM, pp. 241-244, 2010 and EP 2 120 266A1, hereby incorporated by reference in their entirety.

Also the nature of the source and the drain can be determined by the person skilled in the art depending on the desired properties of the IFQW transistor 1 and, for example, the properties of the quantum well region 3, the transistor source 8, the transistor drain 11, the transistor gate 5, the substrate 2, etc.

FIGS. 2a-2f show the different steps of a preferred embodiment of the method for making an implant free quantum well (IFQW) transistor 1 according to the disclosure.

Figure 2A:
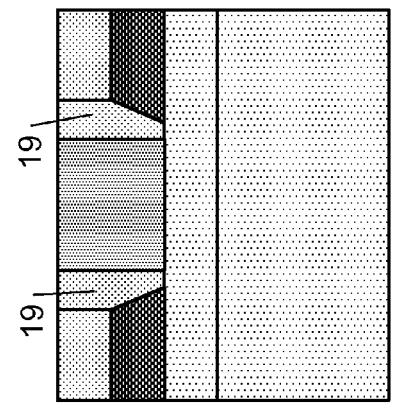
FIGS. 2a-2f show different steps of an embodiment of the method according to the current disclosure.

FIG. 2a shows a first step in which a dummy gate IFQW transistor 20 is provided. The dummy gate IFQW transistor 20 comprises:
the substrate 2,
the quantum well region 3 forming the quantum well of the dummy gate IFQW transistor 20 and overlying the substrate 2,
a dummy gate region 16 overlying a first portion 6 of the quantum well region 3,
a source region 7 forming the transistor source 8 and overlying a second portion 9 different from and adjacent to the first portion 6 of the quantum well region 3 and
a drain region 10 forming the transistor drain 11 and overlying a third portion 12 different from and adjacent to the first portion 6 of the quantum well region 3.

The source region 7 and the drain region 10 are positioned on opposite sides of the dummy gate region 16.

The dummy gate region 16 can be of any type deemed appropriate by the person skilled in the art.

Figure 2D:
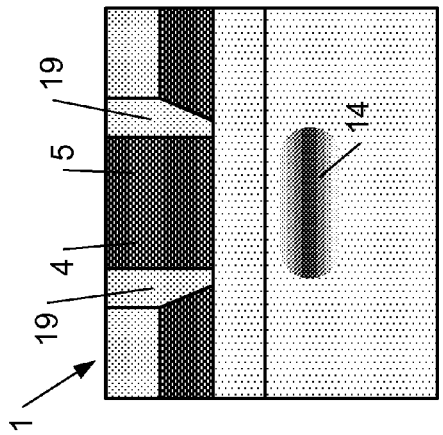
Figure 2B:
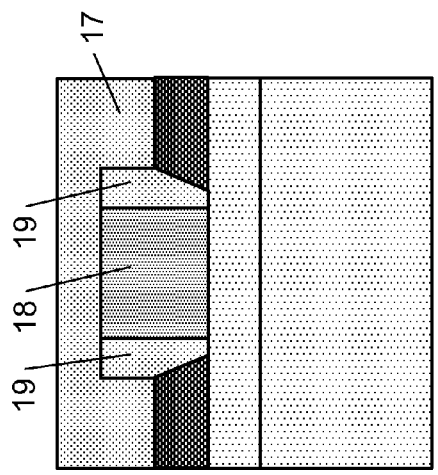

FIG. 2b shows a subsequent preferred step in which an oxide fill 17 is provided at the upper surface 18 of the dummy gate IFQW 20 covering the source region 7, the drain region 10 and the dummy gate region 4. Although this step is not preferred, it provides a protecting layer on top of the source region 7 and the drain region 10 protecting the source region 7 and the drain region 10 during further steps of the method according to the disclosure.

Figure 2E:
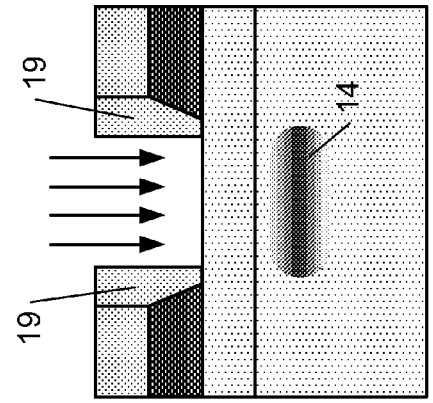
Figure 2C:
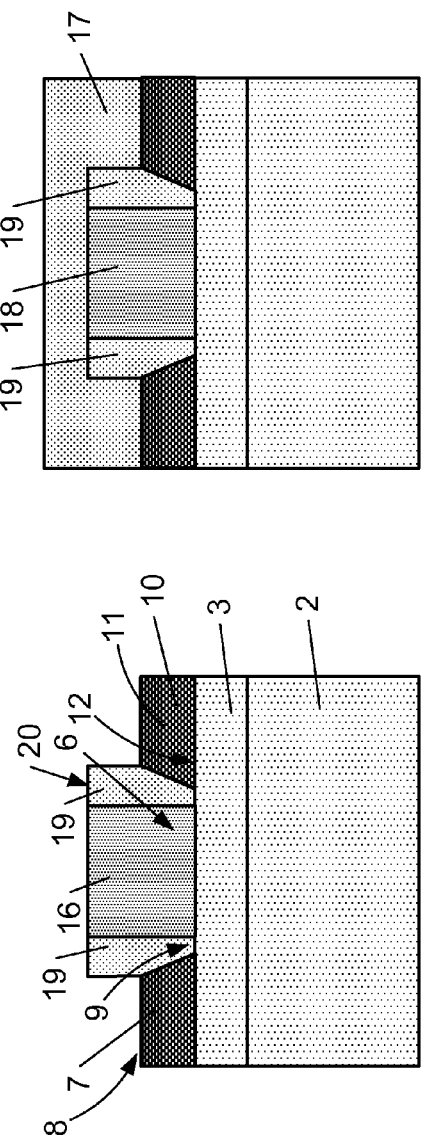

FIG. 2c shows a subsequent preferred step in which after providing the oxide fill 17 the dummy gate region 16 is exposed, preferably by chemical-mechanical polishing, prior to removing the dummy gate region 16. Although this step is not critical for the disclosure, it allows a better removal of the dummy gate region 16 in a subsequent step.

FIG. 2d shows a subsequent step in which the dummy gate region 16 is at least partly removed such as to expose the quantum well region 3. Preferably, this is done by etching. Preferably, the dummy gate region 16 is removed such that the quantum well region 3 beneath the dummy gate region 16 is exposed as much as possible. Thereto, preferably, the dummy gate region 16 is completely removed.

FIG. 2e shows that in a next step the substrate 2 is doped by applying implants to an implant region 14 of the substrate 2 substantially below the first portion 6 of the quantum well region 3 such that an increased concentration of dopants with respect to adjacent regions of the substrate 2 is obtained. As explained above, any type of dopant can be used. Also, the energy with which the dopants are applied in the substrate can be determined by the person skilled in the art. For example a concentration of implants between $1\times10^{17}$ particles per $cm^3$ and $1\times10^{18}$ particles per $cm^3$ is added to the substrate 2, possibly in addition to the existing concentration of dopants in the substrate 2, to create the implant region 14. A similar technique for a different application is for example described in Rubin, L. M. et al, "Process control issues for retrograde well implants for narrow n+/p+ isolation in CMOS," Ion Implantation Technology. 2002. Proceedings of the 14th International Conference on, vol., no., pp. 17-20, 27-27 Sep. 2002, which is hereby incorporated by reference.

Figure 2F:
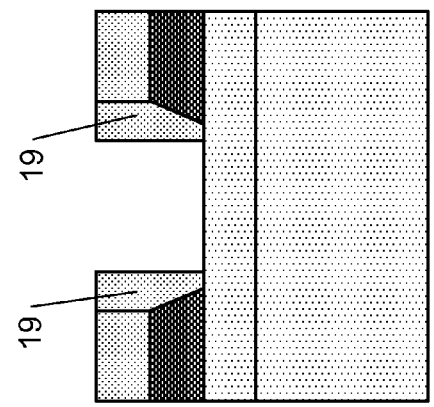

FIG. 2f shows the final step in which a replacement gate region 4 is applied replacing at least partly the removed part of the dummy gate region 16. The replacement gate region 4a forms the transistor gate 5 of the obtained IFQW transistor 1. The replacement gate region 4a is substantially positioned at a side of the quantum well region 3 opposing the implant region 14. The implant region 14 of the substrate 2 controls the mobile charge carrier concentration, provided by the transistor source 8 and the transistor drain 11, for establishing an electrical connection between the transistor source 8 and the transistor drain 11 depending on the gate voltage applied to the transistor gate 5.

What is claimed is:

1. An implant free quantum well (IFQW) transistor comprising:
   a substrate;
   a quantum well region forming a quantum well of the IFQW transistor and overlying the substrate;
   a gate region forming a transistor gate and overlying a first portion of the quantum well region;
   a source region forming a transistor source and overlying a second portion of the quantum well region that is different from and adjacent to the first portion of the quantum well region; and
   a drain region forming a transistor drain and overlying a third portion of the quantum well region that is different from and adjacent to the first portion of the quantum well region, wherein:
   the source region and the drain region are positioned on opposite sides of the gate region;
   the substrate comprises a doped region for controlling a mobile charge carrier concentration for establishing an electrical connection between the transistor source and the transistor drain that depends on a gate voltage applied to the transistor gate, wherein the doped region comprises an implant region having an increased concentration of dopants with respect to a concentration of dopants of adjacent regions of the substrate;

the implant region is substantially positioned at a side of the quantum well region opposing the gate region; and the implant region not substantially extending to below the source region or drain region.

2. An IFQW transistor according to claim 1, wherein the concentration of dopants of the implant region is between $1\times10^{16}$ particles per cm$^3$ and $5\times10^{18}$ particles per cm$^3$.

3. An IFQW transistor according to claim 1, wherein the implant region is enclosed by adjacent regions of the substrate.

4. An IFQW transistor according to claim 1, wherein the doped region is extending at a side of the quantum well region opposing the source region, the drain region, and the gate region.

5. An IFQW transistor according to claim 4, wherein the doped region excluding the implant region has a concentration of dopants of between $1\times10^{16}$ particles per cm$^3$ and $5\times10^{18}$ particles per cm$^3$.

6. An IFQW transistor according to claim 1, wherein the transistor comprises spacers in between the gate region and the source region and the gate region and the drain region for substantially electrically insulating the transistor gate from the transistor source and the transistor drain.

7. An IFQW transistor according to claim 1, wherein a material of at least one of the substrate or the quantum well is a semiconductor of one or more of the following: silicon, germanium, silicon-germanium, III-V compound semiconductors, or antimonides.

8. An IFQW transistor according to claim 7, wherein, when the material of the substrate is at least one of silicon, germanium, or silicon-germanium, the dopants are one or more of the following: boron, gallium, indium, phosphorus, antimonide, or arsenic.

9. An IFQW transistor according to claim 1, wherein the quantum well is layered.

* * * * *